United States Patent
Li et al.

(10) Patent No.: US 9,735,015 B1
(45) Date of Patent: Aug. 15, 2017

(54) FABRICATING METHOD OF SEMICONDUCTOR STRUCTURE

(71) Applicant: UNITED MICROELECTRONICS CORPORATION, Hsinchu (TW)

(72) Inventors: Kun Ju Li, Tainan (TW); Hsin Jung Liu, Kanding Township (TW); Wei-Chuan Tsai, Hemei Township (TW); Min-Chuan Tsai, New Taipei (TW); Yi Han Liao, Taichung (TW); Chun-Tsen Lu, Tainan (TW); Chun-Lin Chen, Tainan (TW); Jui-Ming Yang, Taichung (TW); Kuo-Chin Hung, Puxin Township (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/369,878

(22) Filed: Dec. 5, 2016

(51) Int. Cl.
```
H01L 21/00      (2006.01)
H01L 21/28      (2006.01)
H01L 29/66      (2006.01)
H01L 29/49      (2006.01)
H01L 21/321     (2006.01)
H01L 21/8234    (2006.01)
```

(52) U.S. Cl.
CPC .. *H01L 21/28123* (2013.01); *H01L 21/28079* (2013.01); *H01L 21/3212* (2013.01); *H01L 21/823456* (2013.01); *H01L 29/495* (2013.01); *H01L 29/66545* (2013.01); *H01L 29/66636* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 6,565,422 B1 * | 5/2003 | Homma | B24B 57/02 451/446 |
| 7,767,583 B2 | 8/2010 | Ramappa et al. | |
| 9,169,556 B2 | 10/2015 | Wu et al. | |
| 2002/0100984 A1 * | 8/2002 | Oshima | H01L 21/76801 257/774 |

* cited by examiner

*Primary Examiner* — Angel Roman
(74) *Attorney, Agent, or Firm* — Ding Yu Tan

(57) ABSTRACT

A method of manufacturing a semiconductor structure, comprising: providing a preliminary structure having a first region and a second region and comprising a plurality of first trenches in the first region; forming a metal layer filling the first trenches covering on the preliminary structure, wherein the metal layer comprises a concave portion in the second region and the concave portion defines an opening; forming a metal nitride layer on the metal layer by an nitride treatment; and performing a planarization process to remove the metal nitride layer and a portion of the metal layer to expose the preliminary structure.

19 Claims, 4 Drawing Sheets

FABRICATING METHOD OF SEMICONDUCTOR STRUCTURE

FIELD OF THE INVENTION

The present invention relates to a fabricating method of a semiconductor structure, especially with an improved CMP uniformity.

BACKGROUND OF THE INVENTION

Chemical mechanical polishing (CMP) is widely and increasingly used in integrated circuit (IC) manufacturing as a method of removing material to enable the planarization of a surface of the IC. This planarization may enable accurate photolithography or improve other IC processing steps. In order to remove and planarize material, the CMP process is performed by providing a force from backside of a workpiece making the other side of the workpieces contacting with a rotating polishing pad in a CMP apparatus or chamber. At least one slurry of abrasive particles or reactive solution is also provided during the CMP process to chemically react with the material(s) on the workpiece surface.

However, a CMP process that is performed on metals has many drawbacks. With the advent of scaling, the problems caused by CMP processes, such as dishing, recess, erosion or CMP non-uniformities, become more detrimental because of the sensitivity of resistance to the thickness of a metal, and thus product yield and performances are affected.

Accordingly, there is a need in the art for a process to address the above-described inadequacies and shortcomings to improve the results of a CMP process and thus also to improve product yield and product performance.

SUMMARY OF THE INVENTION

The present invention provides a method of manufacturing a semiconductor structure, comprising: providing a preliminary structure having a first region and a second region and comprising a plurality of first trenches in the first region; forming a metal layer filling the first trenches covering on the preliminary structure, wherein the metal layer comprises a concave portion in the second region and the concave portion defines an opening; forming a metal nitride layer on the metal layer by an nitride treatment; and performing a planarization process to remove the metal nitride layer and a portion of the metal layer to expose the preliminary structure.

In one embodiment of the present invention, wherein the preliminary structure comprises a second trench in the second region, and a second width of the second trench is larger than a first width of the first trench.

In one embodiment of the present invention, wherein the first width is in a range of 30-80 angstroms and the second width is in a range of 50-500 nm.

In one embodiment of the present invention, wherein the opening is in an area covered by the second trench.

In one embodiment of the present invention, wherein the semiconductor structure is a fin-shaped field effect transistor and the step of providing the preliminary structure comprises: providing a substrate; forming a fin structure by removing a portion of the substrate; forming a dummy gate layer comprising a plurality of dummy gate bars, the dummy gate bars have different widths and are parallelly across on the fin structure; forming pairs of spacers on two opposite sidewalls of each of the dummy gate bars; removing a portion of the fin structure by using the dummy gate layers and the spacers as a mask; epitaxially growing a source/drain structure on two sides of each of the dummy gate bars, where the portion of the fin structure is removed; forming an interlayer dielectric layer on the source/drain structure in-between different pairs of the spacers; and removing the dummy gate layer to form the first trenches in the first regions and the second trench in the second region.

In one embodiment of the present invention, wherein the metal layer is a tungsten layer.

In one embodiment of the present invention, wherein the tungsten layer is formed by a seam suppressed tungsten gap fill process.

In one embodiment of the present invention, wherein the nitride treatment uses nitrogen gas having a flow rate in a range of 1-10 sccm.

In one embodiment of the present invention, wherein a duration time of the nitride treatment is in a range of 3-30 seconds, and preferably in a range of 3-8 seconds.

In one embodiment of the present invention, wherein a power of the nitride treatment is in a range of 500-2500 watt.

In one embodiment of the present invention, wherein the metal layer has a total thickness in a range of 1600-2200 angstroms.

In one embodiment of the present invention, wherein the metal layer has an overall average thickness of 2000 angstroms.

In one embodiment of the present invention, wherein the metal layer has a thickness above the preliminary structure in a range of 500-800 angstroms.

In one embodiment of the present invention, wherein the metal layer has a thickness above the preliminary structure in a range of 700-800 angstroms.

In one embodiment of the present invention, wherein the first trench has a depth in a range of 300-500 angstroms.

In one embodiment of the present invention, wherein the step of forming the metal nitride layer comprises: forming a metal nucleation layer covering the metal layer; introducing nitride radicals onto the metal nucleation layer to transform the metal nucleation layer into a metal nitride seed layer; and performing a chemical vapor deposition process to form the metal nitride layer.

In one embodiment of the present invention, wherein the metal nucleation layer has the same metal as the metal layer.

In one embodiment of the present invention, wherein the metal nucleation layer is a tungsten nucleation layer and the metal nitride seed layer is a tungsten nitride seed layer.

Accordingly, the present invention provides a fabricating method of a semiconductor structure, or of a fin-shaped field effect transistor (FinFET) structure, including a nitrogen treatment to form a metal nitride layer on a metal layer to improve uniformity of a CMP process, by providing a metal nitride layer on the gate metal layer in a gate-last process before the CMP process. Better CMP results and planar uniformity can thus be achieved by avoiding dishing/recessed condition resulting from properties of a CVD process of the metal layer due to a greater hardness of the metal nitride layer in the concave portion of the metal layer in the area covered by a wider trench. Therefore, product yields and performances are accordingly improved.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention provides a fabricating method of a semiconductor structure including a nitrogen treatment step before a CMP process to improve uniformity of CMP result, and thus to improve product yields and performances. It is to be noted that the following descriptions of preferred embodiments of this invention are presented herein for purpose of illustration and description only but not intended to be exhaustive or to be limited to the precise form disclosed.

In the following illustration, the element arranged repeatedly is described in word "one", "a" or "an" for simpler explanation. However, one skilled in the art should understand the practical structure and arrangement of each element based on the following illustration and figures provided in the present application.

Figure 1:
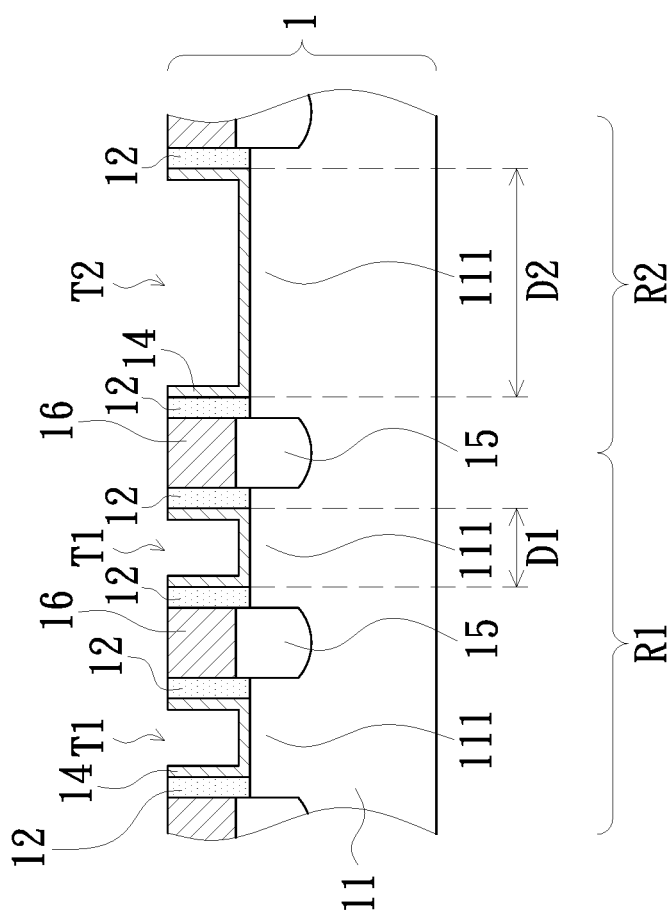
FIG. 1 is a cross-sectional view of a preliminary structure according to an embodiment of the present invention.

A gate-last process is commonly used in a metal gate semiconductor manufacturing process, and in the following description, the present invention is illustrated by applying a gate-last process to manufacturing a FinFET structure. However, it is not intended to limit the present invention, and the present invention can be applied to manufacture any type of semiconductor structure as long as the its fabrication including a CMP process. According to an embodiment as shown in FIG. 1, a preliminary structure 1 having a first region R1 and a second region R2, and comprising a plurality of first trenches T1 in the first region R1 and at least a second trench T2 in the second region R2 is formed, wherein a width D2 of the second trench T2 is larger than a width D1 of the first trench T1. Formation of the preliminary structure 1 comprises the following sub-steps: providing a substrate 11; forming a fin structure 111 by removing a portion of the substrate 11; forming a dummy gate layer (not shown) comprising a plurality of dummy gate bars (not shown), the dummy gate bars have different widths and are disposed parallelly across on the fin structure 111, wherein the dummy gate bars (not shown) in the first region R1 are thinner than the dummy gate bars (not shown) in the second region R2; forming a pair of spacers 12 on two opposite sidewalls of each of the dummy gate bars; removing a portion of the fin structure 111 by using the dummy gate layers and the spacers 12 as a mask; epitaxially growing a source/drain structure 15 on two sides of each of the dummy gate bars, where the portion of the fin structure 111 is removed; forming an interlayer dielectric layer 16 on the source/drain structure 15 in-between different pairs of the spacers 12; removing the dummy gate layers to form the first trenches T1 in the first regions R1 and the second trench T2 in the second region R2; and optionally forming a gate dielectric layer 14 conformally inside the trenches T1 and T2, wherein the gate dielectric layer 14 can be a single or multi-layer structure comprising at least one of nitride, oxide, and oxynitride. Other optional material layers, such as a work function metal layer, can be optionally formed inside the trenches T1 and T2 depending on different cases. And the gate dielectric layer 14 (and/or other optional layers) can be conformally formed inside the trenches T1 and T2 or only on the entire bottom surface of the trenches T1 and T2. The figures shown merely the embodiment of the present invention but not intend to limit the present invention. The trenches T1 and T2 can also be formed by different steps following known concepts of "gate-last" process. For example, forming the gate dielectric layer 14 before the dummy gate layers and thus to form the gate dielectric layer 14 only covers the bottom surface of the trenches T1 and T2.

In the present invention, the first region R1 and second region R2 are different active regions and thus have different widths D1 and D2 of the trenches T1 and T2 respectively. The first width D1 is in a range of 30-80 angstroms, and the second width D2 is in a range of 50-500 nanometers (nm). The widths D1 and D2 of the trenches T1 and T2 are defined by widths of different dummy gate bars of the dummy gate layer formed in the regions R1 and R2 respectively. Moreover, depths of the trenches T1 and T2 are also defined by heights of different dummy gate bars and the spacers 12 formed in the regions R1 and R2 respectively. In the embodiment, the trenches T1 and T2 have the same depth in a range of 300-500 angstroms.

Figure 2:
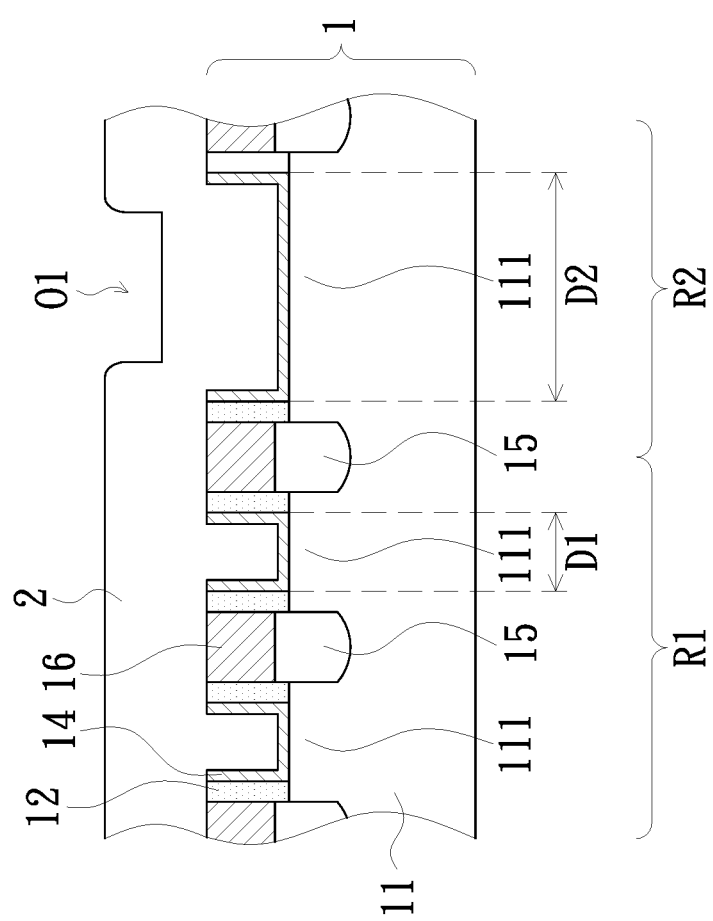
FIGS. 2-3 are a plurality of cross-sectional views of different fabricating steps according to the embodiment of the present invention.

Then as shown in FIG. 2, a metal layer 2 is formed filling the first trenches T1 and the second trenches T2 covering on the preliminary structure 1, wherein the metal layer 2 comprises a concave portion in the second region R2 and the concave portion defines an opening O1. The metal layer 2 can be formed by traditional CVD (chemical vapor deposition) process or a seam suppressed tungsten (SSW) gap fill process by forming a nucleation seed layer first and then performing CVD process. And because the second width D2 is much larger than the first width D1, the concave portion is formed in the second region R2 inside the area vertically covered by the second trench T2 due to characteristics of a deposition process. The metal layer 2 has a total thickness (from a bottom of the trenches T1 and T2 to a top of the metal layer 2) in a range of 1600-2200 angstroms and a thickness above the preliminary structure 1 (the portion of the metal layer 2 from the top thereof higher than a top of the preliminary structure 1) at least in a range of 500-800 angstroms. The metal layer 2 in this embodiment is a tungsten layer, which has an overall average thickness of 2000 angstroms and a thickness above the preliminary structure 1 in a range of 700-800 angstroms.

Figure 3:
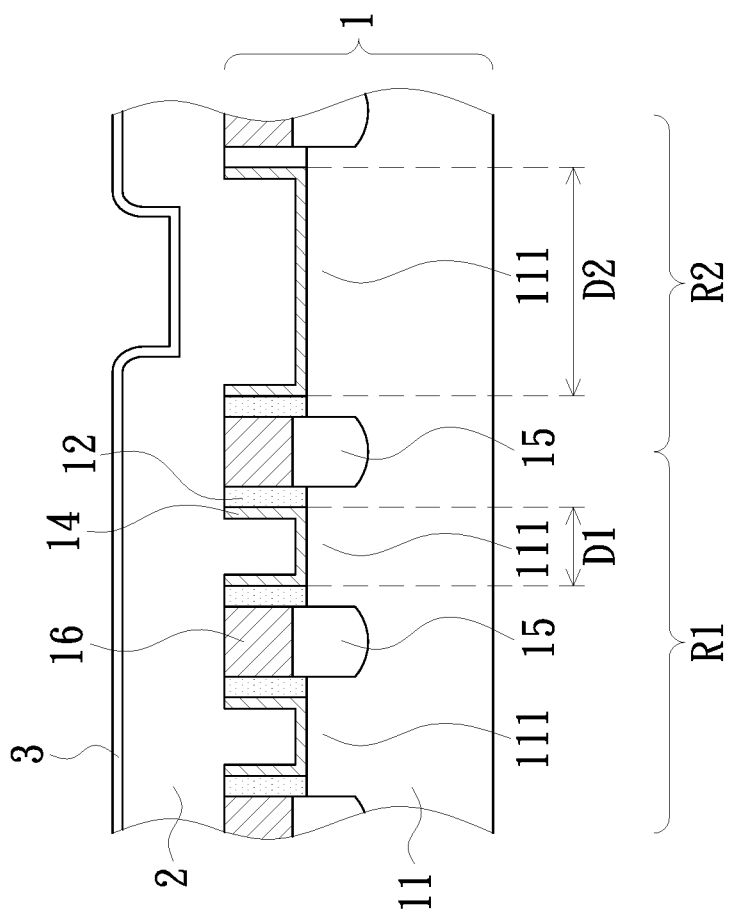

Afterwards, a nitrogen treatment on the metal layer 2 is performed to form a metal nitride layer 3 on the top of the metal layer 2 to be conformally covering the entire metal layer 2 as shown in FIG. 3. The nitrogen treatment is performed with a duration time in a range of 3-30 seconds and with a power in a range of 500-2500 watt, and the nitrogen is introduced with a flow rate in a range of 1-10 sccm. In the embodiment, a tungsten nucleation layer (not shown) having a thickness in a range of 40-60 angstroms is formed first covering the entire metal layer 2, serving as a seed layer. Nitrogen gas is introduced into a RPS (remote plasma source) chamber to be dissociated into nitride radicals, and then the nitride radicals are introduced onto the tungsten nucleation layer to be transformed into a tungsten nitride seed layer. Afterward, a tungsten nitride deposition process is then performed (can be in a different chamber) to form a tungsten nitride layer as the metal nitride layer 3 shown in FIG. 3. Thus, the metal nitride layer 3 is formed from the top of the metal layer 2 in an upward (direction) that is away from the metal layer 2. The metal nitride layer 3 has a hardness greater than a hardness of the metal layer 2 and is in a range of 14.4-34.5 GPa. In other embodiments, a nucleation layer (instead of the tungsten nucleation layer) can use other metal material to form a metal nucleation layer and a metal nitride seed layer, and the metal material (composition) used as the nucleation layer is preferably the same metal material (composition) as the metal layer 2. And in this embodiment, the duration time for the nitrogen treatment is in a range of 3-8 seconds.

Figure 4:
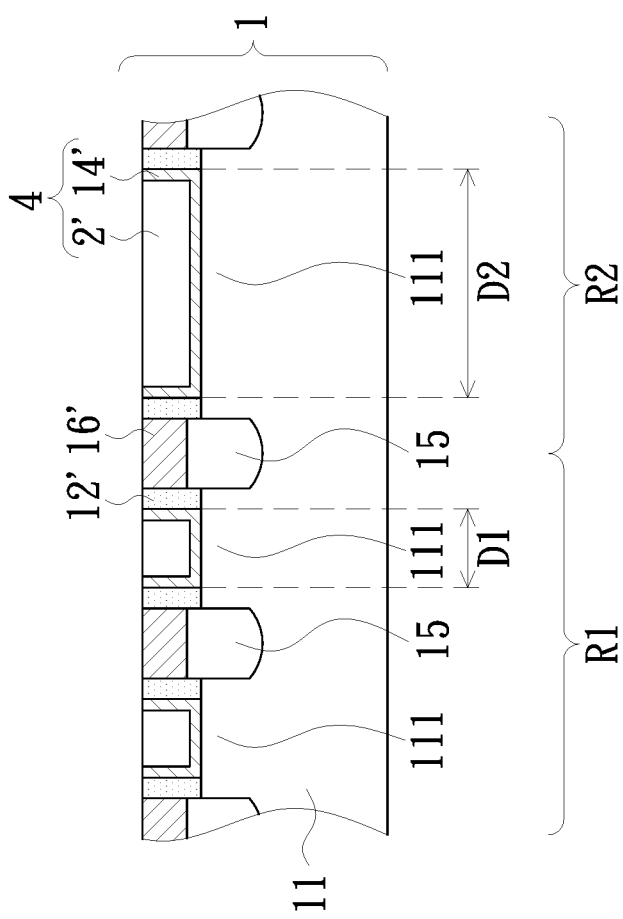
FIG. 4 is a cross-sectional view after a CMP process according to the embodiment of the present invention.

Then as shown in FIG. 4, a planarization process is then performed to remove the metal nitride layer 3 and a portion of the metal layer 2 to expose the preliminary structure 1 and form a metal gate structure 4, which comprises a metal layer 2' and a gate dielectric layer 14' (and other optional layers if any). In the embodiment, a top portion of the preliminary structure 1 (including a top portion of the interlayer dielectric layer 16, a top portion of the spacers 12 and a top portion of the gate dielectric layer 14) is also removed to form a plurality of spacers 12' and an interlayer dielectric layer 16' due to over-etching. In other embodiment, the planarization process stops just at the top surface of the preliminary structure 1, and the gate dielectric layer 14' is just the same as the gate dielectric layer 14, and other elements, such as the spacers 12, the interlayer dielectric layer 16, and other optional layers, remain unetched.

In the traditional CMP process, due to the presence of the concave portion disposed over a wider trench and properties of the CMP process, it shows that the metal layer in the wider trench is recessed and has a worse planar uniformity than other regions having narrower trenches. However, the present invention includes a nitrogen treatment on the metal layer to form a metal nitride layer that has a hardness which is harder than the metal layer. Thus, when the planarization process reaches a portion of the metal nitride layer 3 in the opening O1, especially at the bottom of the opening O1, in the region R2, a removal rate of the metal layer 2 in the region R1 is higher than a removal rate of the metal layer 2 in the region R2 over the area vertically covered by the second trench T2 due to the greater hardness of the metal nitride layer 3 than that of the metal layer 2. Therefore, better CMP results and planar uniformity can be achieved. And product yields and performances are accordingly improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of manufacturing a semiconductor structure, comprising:
    providing a preliminary structure having a first region and a second region, and the preliminary structure comprising a plurality of first trenches in the first region;
    forming a metal layer filling the first trenches covering on the preliminary structure, wherein the metal layer comprises a concave portion in the second region and the concave portion defines an opening;
    forming a metal nitride layer on the metal layer by a nitride treatment; and
    performing a planarization process to remove the metal nitride layer and a portion of the metal layer to expose the preliminary structure.

2. The method of manufacturing the semiconductor structure according to claim 1, wherein the preliminary structure further comprises a second trench in the second region, and a second width of the second trench is larger than a first width of the first trench.

3. The method of manufacturing the semiconductor structure according to claim 2, wherein the first width is in a range of 30-80 angstroms and the second width is in a range of 50-500 nm.

4. The method of manufacturing the semiconductor structure according to claim 2, wherein the opening of the concave portion is in an area covered by the second trench.

5. The method of manufacturing the semiconductor structure according to claim 2, wherein the semiconductor structure is a fin-shaped field effect transistor and the step of providing the preliminary structure comprises:
    providing a substrate;
    forming a fin structure by removing a portion of the substrate;
    forming a dummy gate layer comprising a plurality of dummy gate bars, the dummy gate bars have different widths and are disposed parallelly across on the fin structure;
    forming a plurality of different pairs of spacers on two opposite sidewalls of each of the dummy gate bars;
    removing a portion of the fin structure by using the dummy gate layers and the different pairs of spacers as a mask;
    epitaxially growing a source/drain structure on two sides of each of the dummy gate bars, where the portion of the fin structure is removed;
    forming an interlayer dielectric layer on the source/drain structure in-between the different pairs of the spacers; and
    removing the dummy gate layer to form the first trenches in the first regions and the second trench in the second region.

6. The method of manufacturing the semiconductor structure according to claim 1, wherein the metal layer is a tungsten layer.

7. The method of manufacturing the semiconductor structure according to claim 6, wherein the tungsten layer is formed by a seam suppressed tungsten gap fill process.

8. The method of manufacturing the semiconductor structure according to claim 1, wherein the nitride treatment uses nitrogen gas having a flow rate in a range of 1-10 sccm.

9. The method of manufacturing the semiconductor structure according to claim 1, wherein a duration time of the nitride treatment is in a range of 3-30 seconds.

10. The method of manufacturing the semiconductor structure according to claim 9, wherein the duration time of the nitride treatment is in a range of 3-8 seconds.

11. The method of manufacturing the semiconductor structure according to claim 1, wherein a power of the nitride treatment is in a range of 500-2500 watt.

12. The method of manufacturing the semiconductor structure according to claim 1, wherein the metal layer has a total thickness in a range of 1600-2200 angstroms.

13. The method of manufacturing the semiconductor structure according to claim 1, wherein the metal layer has an overall average thickness of 2000 angstroms.

14. The method of manufacturing the semiconductor structure according to claim 1, wherein the metal layer has a thickness above the preliminary structure in a range of 500-800 angstroms.

15. The method of manufacturing the semiconductor structure according to claim 14, wherein the metal layer has a thickness above the preliminary structure in a range of 700-800 angstroms.

16. The method of manufacturing the semiconductor structure according to claim 1, wherein the first trench has a depth in a range of 300-500 angstroms.

17. The method of manufacturing the semiconductor structure according to claim 1, wherein the step of forming the metal nitride layer comprises:
 forming a metal nucleation layer covering the metal layer;
 introducing nitride radicals onto the metal nucleation layer to transform the metal nucleation layer into a metal nitride seed layer; and
 performing a chemical vapor deposition process to form the metal nitride layer.

18. The method of manufacturing the semiconductor structure according to claim 17, wherein the metal nucleation layer has the same metal material as the metal layer.

19. The method of manufacturing the semiconductor structure according to claim 17, wherein the metal nucleation layer is a tungsten nucleation layer and the metal nitride seed layer is a tungsten nitride seed layer.

* * * * *